United States Patent
Balram et al.

(10) Patent No.: US 9,368,579 B2
(45) Date of Patent: Jun. 14, 2016

(54) SELECTIVE AREA GROWTH OF GERMANIUM AND SILICON-GERMANIUM IN SILICON WAVEGUIDES FOR ON-CHIP OPTICAL INTERCONNECT APPLICATIONS

(71) Applicant: The Board of Trustees of the Leland Stanford Junior University, Palo Alto, CA (US)

(72) Inventors: Krishna Coimbatore Balram, Stanford, CA (US); Stephanie A. Claussen, Denver, CO (US); David A. B. Miller, Stanford, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 180 days.

(21) Appl. No.: 13/762,140

(22) Filed: Feb. 7, 2013

(65) Prior Publication Data

US 2013/0200431 A1 Aug. 8, 2013

Related U.S. Application Data

(60) Provisional application No. 61/596,140, filed on Feb. 7, 2012.

(51) Int. Cl.
| | |
|---|---|
| *H01L 29/12* | (2006.01) |
| *H01L 21/02* | (2006.01) |
| *H01L 29/20* | (2006.01) |

(52) U.S. Cl.
CPC ............ *H01L 29/12* (2013.01); *H01L 21/0245* (2013.01); *H01L 21/0262* (2013.01); *H01L 21/02365* (2013.01); *H01L 21/02381* (2013.01); *H01L 21/02488* (2013.01); *H01L 21/02502* (2013.01); *H01L 21/02532* (2013.01); *H01L 21/02639* (2013.01); *H01L 29/20* (2013.01)

(58) Field of Classification Search
CPC .... G02B 6/132; G02B 6/131; G02B 6/12004; G02B 6/136; G02F 1/025
USPC ............ 257/183, 315, 332, E21.09, E21.002; 438/478, 479, 257; 385/14; 372/34
See application file for complete search history.

(56) References Cited

U.S. PATENT DOCUMENTS

| | | | |
|---|---|---|---|
| 2002/0142544 A1* | 10/2002 | Wang | H01L 21/76224 438/257 |
| 2011/0007761 A1* | 1/2011 | Assefa | G02B 6/12004 372/34 |
| 2012/0219250 A1* | 8/2012 | Ren | G02B 6/132 385/14 |
| 2012/0251034 A1 | 10/2012 | Chen et al. | |
| 2012/0288971 A1 | 11/2012 | Bogaerts et al. | |

* cited by examiner

*Primary Examiner* — Kenneth Parker
*Assistant Examiner* — Bo Fan
(74) *Attorney, Agent, or Firm* — Lumen Patent Firm (57) ABSTRACT

A robust fabrication process for selective area growth of semiconductors in growth windows is provided. Sidewall growth is eliminated by the presence of a spacer layer which covers the sidewalls. Undesirable exposure of the top corners of the growth windows is prevented by undercutting the growth window prior to deposition of the dielectric spacer layer. The effectiveness of this process has been demonstrated by selective-area growth of Ge and Ge/SiGe quantum wells on a silicon substrate. Integration of active optoelectronic devices with waveguide layers via end-coupling through the dielectric spacer layer can be reliably accomplished in this manner.

15 Claims, 6 Drawing Sheets

SELECTIVE AREA GROWTH OF GERMANIUM AND SILICON-GERMANIUM IN SILICON WAVEGUIDES FOR ON-CHIP OPTICAL INTERCONNECT APPLICATIONS

CROSS REFERENCE TO RELATED APPLICATIONS

This application claims the benefit of US provisional patent application 61/596,140, filed on Feb. 7, 2012, entitled "Selective Area Growth of Germanium and Silicon-Germanium in Silicon Waveguides for On-chip Optical Interconnect Applications", and hereby incorporated by reference in its entirety.

FIELD OF THE INVENTION

This invention relates to integration of dissimilar materials for optoelectronic devices using selective area growth.

BACKGROUND

Selective area growth is a process where semiconductor material is epitaxially grown in features that are lithographically fabricated (e.g., trenches etc.). These features are often referred to as growth windows. With this process, dissimilar materials can be integrated on a single substrate. However, it can be difficult to obtain high quality growth with selective area growth.

One common source of difficulty in selective area growth is simultaneous growth on the bottom and side walls of a trench. This usually leads to poor results, such as electrical shorts in p-n junctions, and lack of planarity in fabricated devices, among others.

One approach for dealing with this is to fabricate a spacer layer at the side walls of the growth windows. By choosing the spacer layer to be a material on which growth of the semiconductor material does not occur (e.g., an oxide layer), the problem of lateral growth during selective area growth can be alleviated. U.S. 2012/0219250, hereby incorporated by reference in its entirety, provides an example of this approach.

However, we have found that difficulties can remain, even with a side wall protective layer. Accordingly, it would be an advance in the art to alleviate these difficulties.

SUMMARY

Figure 1A:
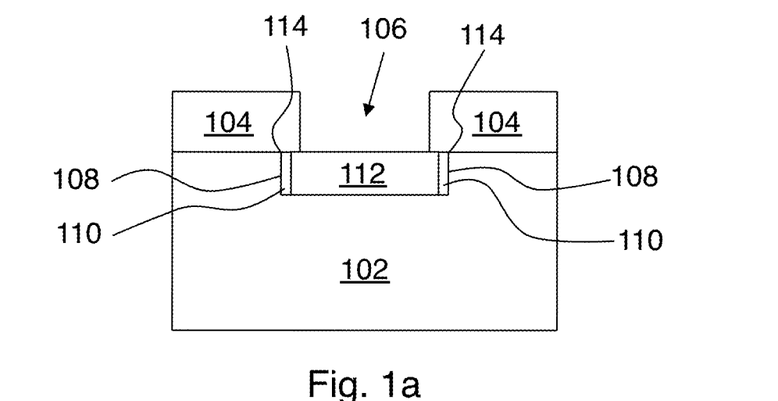
FIGS. 1a-c show some exemplary embodiments of the invention.
Figure 1B:
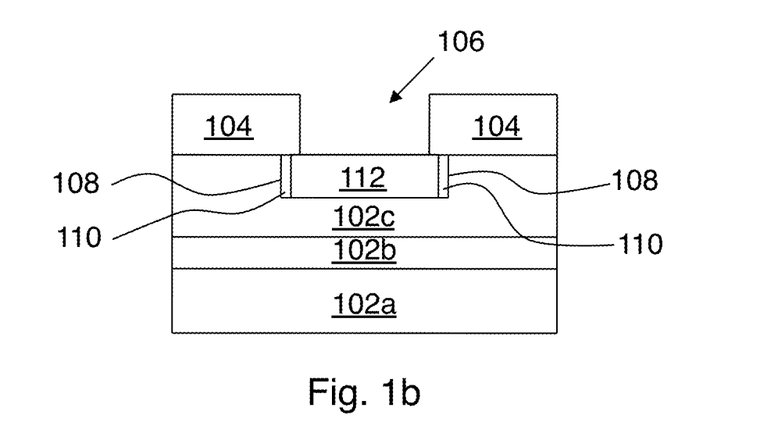
Figure 1C:
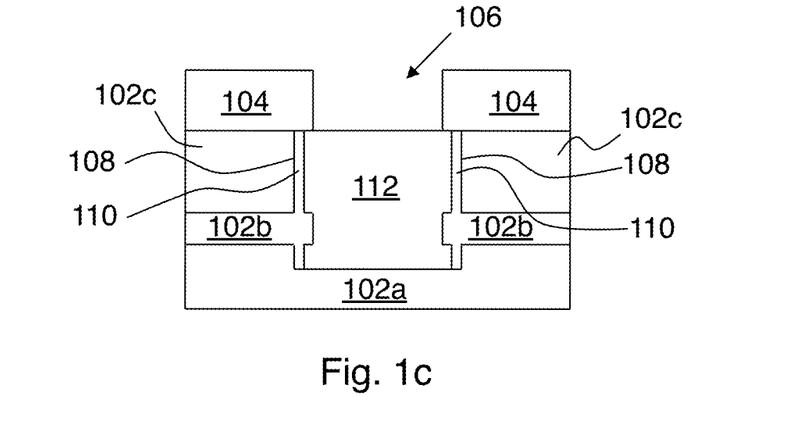

In this work, selective area growth is improved by undercutting the side walls prior to deposition of the side wall protective layer. FIGS. 1a-c show exemplary structures that can result from this approach. In all cases, the top protective layer 104 overhangs the side protective layer 110, as shown. The purpose of this overhang is to prevent the exposure of semiconductor material at corners of the trench (e.g., 114 on FIG. 1a).

Figure 2:
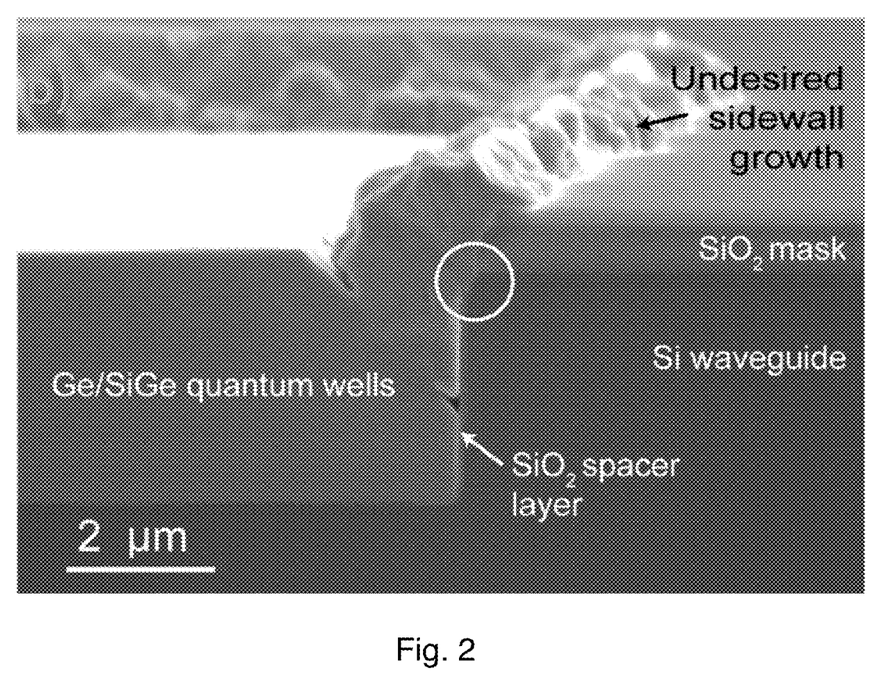
FIG. 2 shows an example of poor selective area growth results due to exposed trench corners.
Figure 3A:
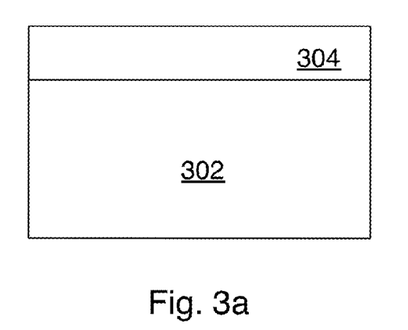
FIGS. 3a-f show an exemplary fabrication sequence relating to an InP substrate.
Figure 3B:
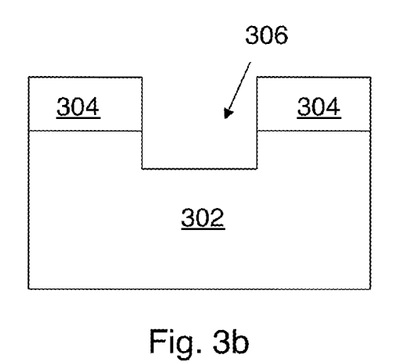
Figure 3C:
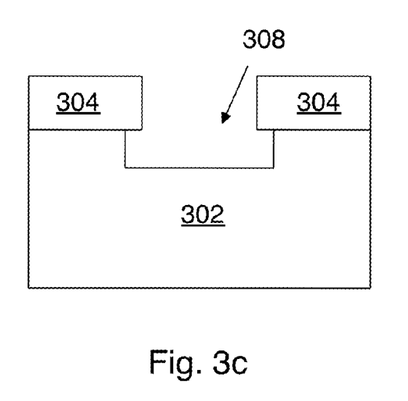
Figure 3D:
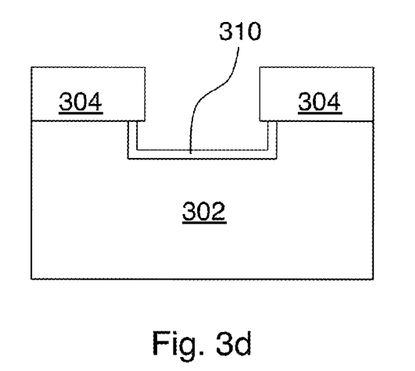
Figure 3E:
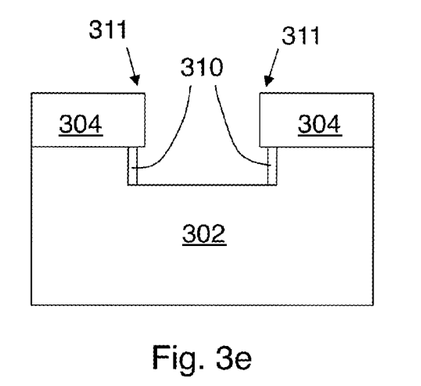
Figure 3F:
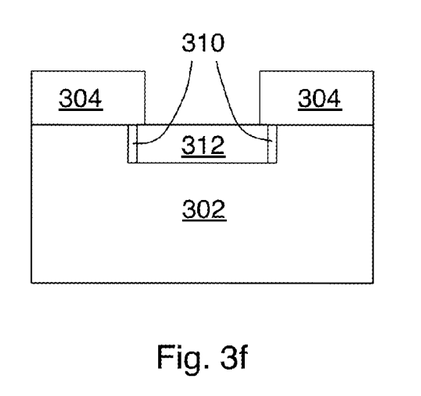

If semiconductor material becomes exposed at corners of the trench, as can easily occur in a side wall protective layer process without an overhang of the top protective layer, growth quality can be severely compromised. FIG. 2 shows an example of what can happen. In this example, undesired side wall growth starts at an exposed corner (circled on the figure) of a silicon waveguide layer, even though a side wall protective layer is present.

Figure 6A:
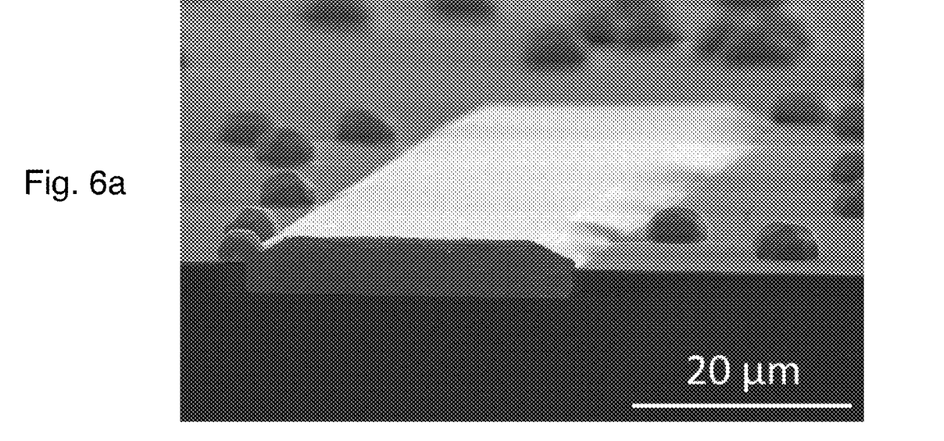
FIGS. 6a-b show selective area growth results for Ge on Si using the present approach.
Figure 6B:
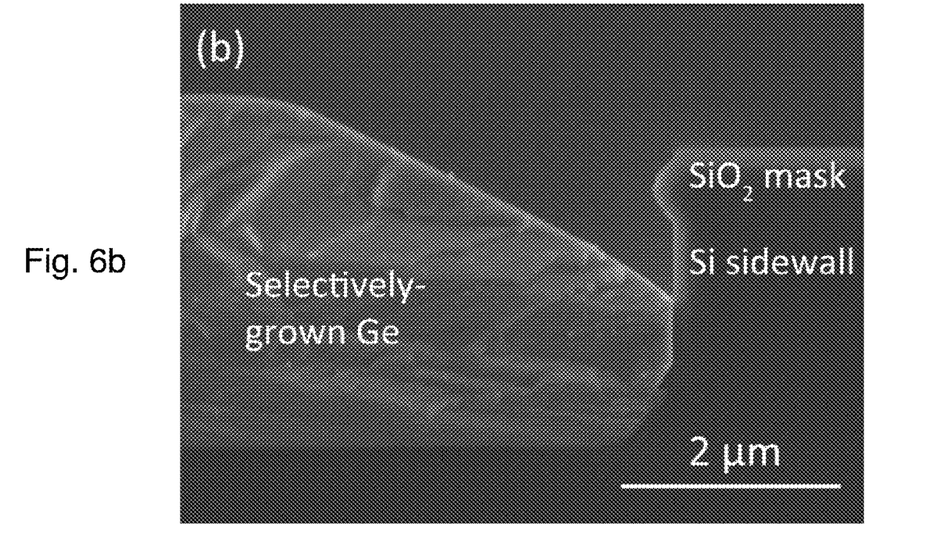

In contrast, with the present approach, this problem of growth on an exposed corner can be avoided, as seen in the results of FIGS. 6a-b.

This approach has numerous applications. Integration of Ge and/or SiGe active optoelectronic devices with silicon technology is one important example. One of the key requirements for the realization of on-chip optical interconnects is the integration of different materials and device designs. Silicon-on-insulator (SOI) waveguides have been extensively used for routing light on-chip, but silicon is severely limited in its use as an optical detector and modulator in the C-band (1530-1565 nm), the de-facto standard range of wavelength operation for telecommunications. This constraint is primarily due to silicon being an indirect bandgap material. Germanium, which is also considered an indirect bandgap material, also has a direct bandgap near the C-band, and hence is promising for use in both detectors and modulators. Given the extensive use of SOI waveguides, an effective means of integrating germanium with this platform is highly desirable. The present approach can provide such integration of Ge with SOI.

Some of the key benefits of this undercutting process are that it is quite immune to the angle of the sidewall etch (because the undercut can always be chosen to be sufficiently wide so as to protect the sidewall, irrespective of the sidewall angle), thereby relaxing the constraint on etch chemistry. It also does not require the deposition of a highly conformal oxide, thereby reducing the complexity of fabrication. By undercutting the sidewalls, we can also eliminate other steps from the more conventional processes, resulting in simpler and more reliable fabrication.

This approach could also work for selective growth of other materials such as III-V semiconductors that similarly could use the silicon as a crystalline template. Other substrates can also be employed, e.g., InP. The growth methods of the semiconductors (e.g. Reduced Pressure Chemical Vapor Deposition) could also vary. The composition of the top oxide cladding layer and the interposer layer on the sidewalls could be modified, based on what processes provides the best selectivity and easiest fabrication. The isotropic etch used to undercut the silicon can also be varied to achieve different etch profiles.

DETAILED DESCRIPTION

In the following description, section A relates to general principles and some simple exemplary fabrication sequences. Section B provides a more detailed experimental example.

A) General Principles

FIGS. 1a-c show some exemplary embodiments of the invention. The example of FIG. 1a shows a substrate including a first semiconductor layer 102 and a primary protective layer 104 disposed on first semiconductor layer 102. A trench 106 is formed in the substrate that extends through primary protective layer 104 and into first semiconductor layer 102. Trench 106 is undercut, such that part or all of its side walls are disposed beneath the primary protective layer 104. Here the trench side walls are referenced as 108, and it is apparent that side walls 108 are beneath protective layer 104. A secondary protective layer 110 is disposed on side walls 108. A second semiconductor 112 is formed by growth in the trench. First semiconductor layer 102 and second semiconductor 112 have different compositions. FIGS. 3a-f, described in greater detail below, provide an exemplary fabrication sequence for this device structure. One example of a structure as in FIG. 1a has InP for first semiconductor layer 102, silicon oxide as the primary protective layer 104, silicon oxide as the secondary protective layer 110, and InGaAsP as the second semiconductor 112. Other materials for the semiconductors and protective layers can also be employed.

The example of FIG. 1b is similar to the example of FIG. 1a, except that the substrate for FIG. 1b includes more layers. More specifically, this substrate includes a first semiconductor layer 102c, a buried insulator layer 102b, and a semiconductor substrate 102a. This device configuration can occur when a silicon on insulator substrate is employed. In this case, semiconductor substrate 102a is silicon, buried layer 102b is silicon oxide, first semiconductor layer 102c is silicon, and top protective layer 104 is silicon oxide. In this example, trench 106 extends through protective layer 104 and into the upper semiconductor layer (i.e., layer 102).

It is also possible for trench 106 to extend into the lower semiconductor layer of an SOI substrate. An example of such a configuration is shown on FIG. 1c. In this example, there are three primary protective layers (i.e., oxide 104, silicon 102c and oxide 102b). Trench 106 passes through these three layers and extends into the silicon substrate 102a. Thus, embodiments of the invention can have one or more primary protective layers. In the example of FIG. 1c, silicon substrate 102a is the "first semiconductor layer" into which the trench extends, but does not pass through.

In many cases of interest, second semiconductor 112 is laterally coupled to a semiconductor waveguide layer by end coupling through secondary protective layer 110. The examples of FIGS. 1b-c can relate to this important case for practical applications. More specifically, in these examples semiconductor layer 102c can be a waveguide layer. From these examples, it is apparent that the first semiconductor layer can be a waveguide layer (FIG. 1b), or that the waveguide layer can be included in the one or more primary protective layers (FIG. 1c). In these examples, layers 102b and 104 can be waveguide cladding layers, and layer 102c can be the waveguide core layer.

The present approach is applicable to integration of any kind of optoelectronic device, including but not limited to: optical modulators, optical detectors, and optical sources. Any of these devices can be integrated with waveguides by end coupling through the secondary protective layer. As shown on FIGS. 1a-c, the second semiconductor 112 preferably makes contact with the secondary protective layer at one or more locations beneath the primary protective layer(s). In other words, the overhang/undercut preferably is present after deposition of the secondary protective layer, and growth of second semiconductor 112 preferably fills in spaces beneath the primary protective layer(s). In most cases, growth of second semiconductor 112 naturally tends to fill in such spaces, so special measures to ensure this are usually not necessary.

The present approach is applicable to any compatible combination of materials for the first semiconductor layer and the second semiconductor. Suitable substrates include, but are not limited to: silicon on insulator, silicon, indium phosphide, and gallium arsenide. The first semiconductor layer can be any semiconductor, including but not limited to: silicon, indium phosphide, and gallium arsenide. The second semiconductor can be any semiconductor, including but not limited to: germanium, a SiGe alloy, an AlGaAs alloy, an InGaAs alloy, and an InGaAsP alloy. For example, the present approach can be extended to the growth of vertical cavity surface emitting lasers (VCSELs) made of AlGaAs/GaAs on patterned GaAs substrates. Suitable materials for the protective layers include, but are not limited to: dielectrics, silicon oxide, silicon nitride, silicon, and densified low temperature oxide (LTO). Side wall protective layer thicknesses are preferably in a range between 30 nm and 70 nm. Thicker layers are more robust in fabrication, but cause higher optical loss, while thinner layers cause lower optical loss, but have less robust fabrication. This trade off can be considered to determine the side wall layer thickness in specific cases. Second semiconductor 112 can partially fill the trench, completely fill the trench, or over-fill the trench. FIGS. 1a-c show examples of under-filling the trench, and FIGS. 6a-b show examples of over-filling the trench.

FIGS. 3a-f show an exemplary fabrication sequence relating to InGaAsP/InP quantum well laser diodes on patterned InP substrates. The development of photonic integrated circuits (PICS) on an InP platform would benefit greatly from the ability to get defect-free growth of lasers, modulators and detectors inside waveguides which link these devices together. The process of this example starts with an InP substrate 302. A layer 304 of $SiO_2$ is deposited using plasma enhanced chemical vapor deposition (PECVD) to provide the structure of FIG. 3a. This oxide layer serves both as an etch mask for the InP etch as well as providing the overhang which prevents sidewall growth. The growth window 306 is patterned with standard RIE oxide and InP etches to provide the structure of FIG. 3b. A wet etchant (e.g., a mixture of HCl and $H_2PO_4$) is used to undercut oxide 304 to provide the oxide overhang, as shown on FIG. 3c (undercut trench 308). This is followed by a conformal oxide deposition (using either PECVD or ALD) to provide secondary protective layer 310 as shown on FIG. 3d. The bottom of the growth window is then dry-etched using an anisotropic RIE etch to provide the structure of FIG. 3e. The oxide on the sidewall is protected by the overhang 311 and does not get etched in this process. When InGaAsP 312 is grown by MBE/MOCVD, the growth occurs only on the bottom face as the sidewalls have amorphous oxide on them which inhibits growth. The resulting structure is shown on FIG. 3f.

Figure 4A:
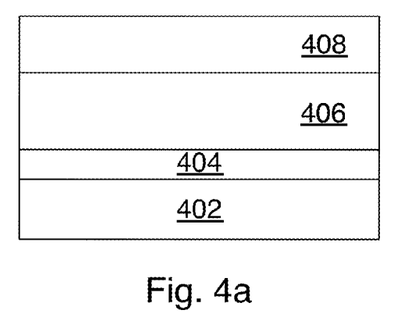
FIGS. 4a-f show an exemplary fabrication sequence relating to a silicon on insulator substrate.
Figure 4B:
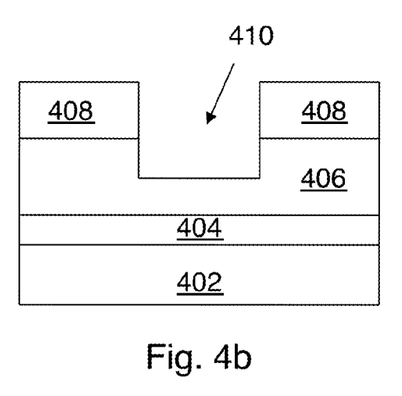

FIGS. 4a-f show an exemplary fabrication sequence relating to a silicon on insulator substrate. The process of this example begins with a silicon-on-insulator (SOI) wafer (Si substrate 402, buried oxide 404) with silicon waveguides defined in the silicon device layer 406 and $SiO_2$ as a top growth mask layer 408 that also serves as a cladding on the silicon waveguides (FIG. 4a). The wafer is patterned using standard photolithography techniques and the growth windows 410 are etched through the top oxide layer and into the Si layer. The etching can either be stopped above the buried oxide (BOX) 404, leaving a thin layer of silicon from which to start the germanium growth (as shown on FIG. 4b), or it can continue to the silicon substrate 402 and have the growth occur from there (either the silicon device layer or the substrate can serve as a crystalline template for the epitaxial growth).

Figure 4C:
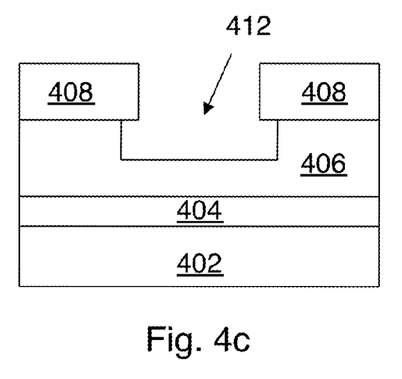
Figure 4D:
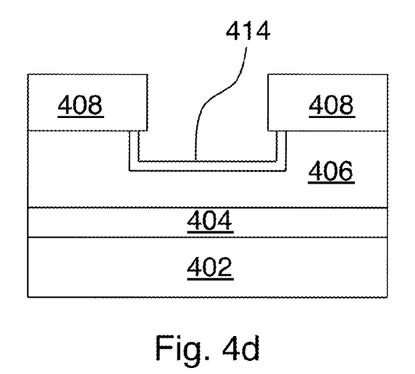
Figure 4E:
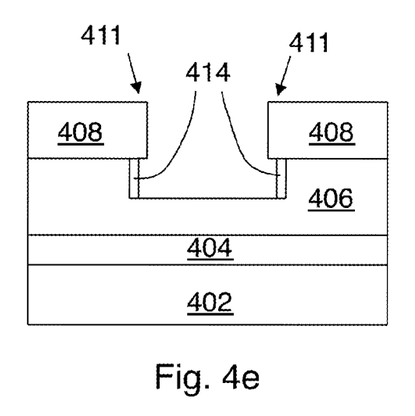
Figure 4F:
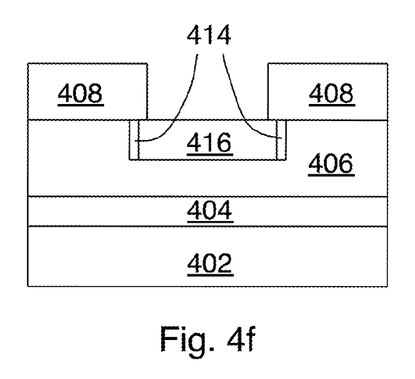

Next, the exposed silicon is isotropically wet etched (using the top oxide 408 as a mask), which results in an undercutting of the silicon sidewalls under the overhanging top $SiO_2$ cladding (modified trench 412 on FIG. 4c). The exposed silicon on the bottom and sidewalls of the growth window can be oxidized by techniques known to those skilled in the art to form the oxide 414 of the interposer layer (FIG. 4d). Thermal oxidation is preferred given its highly conformal nature. An anisotropic dry etch is used to etch away most of the oxide at the bottom of the growth window while leaving the oxide on the sidewalls substantially unetched (given the directional nature of the etch technique, the oxide overhang generated by the undercut protects the sidewalls), and a short wet etch removes the final portion of the oxide at the bottom of the growth window while removing only a small portion of the oxide remaining on the sidewalls. The final wet etch ensures that the silicon surface is not damaged by ion bombardment during the dry etch and hence is suitable for epitaxial growth. This sequence of processes results in $SiO_2$ remaining on the sidewalls of the growth window, protected by the overhanging top oxide 411, and exposed silicon at the bottom of the growth window, now ready for the growth of the germanium. FIG. 4e shows the resulting structure. Finally, growth of second semiconductor 416 (e.g., Ge) results in the structure shown on FIG. 4f.

From these examples, it is apparent that an exemplary fabrication method according to the present approach is as follows:

1) Providing a substrate including a first semiconductor layer and one or more primary protective layers disposed on the first semiconductor layer;
2) Etching through the primary protective layers into the first semiconductor layer to provide a trench having side walls and a bottom;
3) Laterally undercutting at least one of the protective layers by selectively etching the side walls with a side wall etch that preferentially etches the first semiconductor layer with respect to at least one of the protective layers. By definition, an etch preferentially etches A with respect to B if the etch rate of A is greater than the etch rate of B;
4) Forming a secondary protective layer on the side walls and bottom of the trench;
5) Removing the secondary protective layer from the bottom of the trench with a bottom layer etch that completely removes the secondary protective layer on the bottom of the trench and does not completely remove the secondary protective layer on the side walls of the trench; and
6) Growing a second semiconductor in the trench, where the first and second semiconductors have distinct compositions.

As indicated above, it is often preferable to perform the bottom layer etch (step 5 above) in two steps. Here a first step is an anisotropic dry etch that removes some, but not all, of the secondary protective layer on the bottom of the trench, thereby providing a remnant bottom protective layer having a thickness from 10 nm to 20 nm. The second step is a wet etch that removes the remnant bottom protective layer. This approach advantageously avoids surface damage on the bottom of the trench from dry etching that can adversely affect growth of the second semiconductor.

B) Experimental demonstration (Ge selectively grown on Si)

This section relates to an exemplary experimental demonstration of the above-described principles.

B1) Introduction

The ability to selectively grow germanium in specific regions of a silicon substrate is highly desirable for the future integration of Ge-based optoelectronic devices with high-speed Si-based electronic circuits. Potential applications include dense integration of high-performance photodetectors and optical modulators. While selective-area growth of Ge has been investigated since the mid-1980s, using these growth processes in the fabrication of actual devices often introduces additional challenges. For example, selective growth of Ge is commonly carried out by using a dielectric mask such as silicon dioxide ($SiO_2$) or silicon nitride ($Si_3N_4$) above the Si substrate. Growth windows are etched through the dielectric and Ge growth is initiated at the exposed Si surface. Certain device designs require growth of a Ge region inside a Si optical waveguide, with the growth regions etched through the dielectric layer and into the underlying Si waveguide layer. Since any exposed crystalline silicon surface can serve as a growth template for the Ge, the exposed Si sidewalls initiate deleterious growth that affects both the optical and electronic properties of the device. In this work, we demonstrate a fabrication process to reliably prevent growth on these Si sidewalls, even in relatively thick structures, and demonstrate highly selective growth of both Ge and SiGe.

Ge and Ge/SiGe quantum wells (QWs) both exhibit electroabsorption effects (the Franz-Keldysh effect in bulk Ge and the quantum confined Stark effect (QCSE) in Ge/SiGe QWs), where an increase in the applied electric field redshifts the absorption spectrum of the material. This behavior allows the development of compact, high-performance, Ge-based Si-compatible optical modulators for optical interconnect applications. Waveguide-based modulators allow for longer interaction lengths between the optical beam and the active material and easier integration with other on-chip optical components. However, to minimize loss from background absorption in Ge structures, the modulator region must be integrated with low-loss entrance and exit waveguides, such as silicon-on-insulator (SOI) waveguides. These waveguides can be single-mode while still being relatively thick. Coupling between the active Ge region and the passive waveguide can be carried out either evanescently using adiabatic tapers or through direct butt coupling. In the case of adiabatic coupling, a Ge layer is grown directly above the Si layer of the SOI substrate. The adiabatic tapers used are typically very long, increasing the footprint of the device and, if formed out of the active Ge material, increasing the device capacitance. Growing the Ge or Ge/SiGe QWs in growth windows directly in the SOI waveguide, butt-coupling the modulation region to the input and output waveguides, enables a modulator with a small footprint and low capacitance. However, these growth windows can have very thick sidewalls of exposed Si (depending on the thickness of the SOI waveguide), where Ge growth is expected to occur if preventative steps are not taken.

This growth on the exposed Si sidewalls needs to be avoided because it can significantly disturb the planarity of the device, making post-growth fabrication and integration with other devices difficult or requiring chemical mechanical polishing (CMP). Planarity is also important for the optimal performance of heterostructures like QWs. Furthermore, for active devices that rely on pn or p-i-n junctions that are doped in situ during growth, growth on the sidewalls can lead to electrical shorting of the device or high leakage current.

B2) Design Motivation

To prevent sidewall growth and enable high-quality growth in the desired regions, a process was previously proposed (as described in U.S. 2012/0219250) to deposit a dielectric spacer on the sidewalls of the growth windows.

It should be noted that while much of the discussion here focuses on integration with 3 μm-thick SOI waveguides because this is the desired application, the results transfer completely to applications that require selectively growing in growth windows etched into bulk Si substrates or SOI waveguides of different thicknesses. In fact, much of the development of this work and the results shown here were done using Si substrates.

Unfortunately, while this previously proposed spacer fabrication process did allow the demonstration of high-quality QW growth, it was not robust to minor fabrication variations, making mode-matched growth with SOI waveguides unreliable. FIG. 2 presents a typical result, with excessive sidewall growth visible and planar QW growth at the center of the growth window. Despite many efforts to modify this fabrication process, it proved to be very sensitive to minor process variations, which led to poor repeatability and yield. A weak point in the approach was determined to be at the top corner of the Si sidewall, directly under the $SiO_2$ growth mask (circled on FIG. 2). The dielectric spacer was likely removed from this corner during a dry etching step in the substrate fabrication, if the spacer layer at this corner was not sufficiently protected during the etch by the top $SiO_2$ mask.

To overcome this problem of unreliable spacer fabrication and thus substantial sidewall growth, we demonstrate a change in the spacer fabrication process of U.S. 2012/0219250 that renders it largely independent of process variations. When determining a potential fabrication process for the spacer, a few considerations need to be kept in mind. First, it is desirable to make the spacer as thin as possible, to minimize optical loss. The spacer needs to also be formed only on the vertical sidewalls of the growth window, not at the bottom of the window, where the epitaxial growth is initiated. Finally, great care needs to be taken so that the spacer fabrication does not damage this growth surface at the bottom of the window.

B3) Fabrication Process

FIGS. 4a-f illustrate the new process. Beginning with either a Si or SOI wafer, the $SiO_2$ growth mask is formed through thermal oxidation or through deposition of low-temperature oxide (LTO) via low-pressure chemical vapor deposition (LPCVD). If this latter option is used, the LTO is densified at 1100° C. for 1 hour to reduce the number of dangling bonds present; any such dangling bonds likely contribute to undesired growth nucleation on the top $SiO_2$ surface. We found that using thermal $SiO_2$ or densified LTO as the growth mask give comparable selectivity results under the growth conditions used here. The resulting structure is shown on FIG. 4a, where 402 is the Si substrate, 404 is the buried oxide, 406 is the top Si layer, and 408 is the $SiO_2$ growth mask.

Then, the growth windows are patterned using standard photolithography. The top $SiO_2$ layer is etched using a $CHF_3/O_2$ reactive ion etch (RIE). Then, the Si is etched using a timed $HBr/Cl_2/O_2$ RIE etch to the desired depth. Because this process was designed for use on an SOI substrate with a 3 μm-thick Si device layer, the growth windows were etched ~2.8 μm into the Si, to allow a sufficiently thick remaining Si layer (~200 nm) to initiate epitaxial growth. The resulting structure is shown on FIG. 4b, where 410 is the growth window.

After removal of the photoresist, the Si device layer is etched in a wet etchant to undercut the Si sidewalls. Room temperature tetramethylammonium hydroxide (TMAH) was used here. The resulting structure is shown on FIG. 4c, where 412 is the undercut growth window.

Figure 5A:
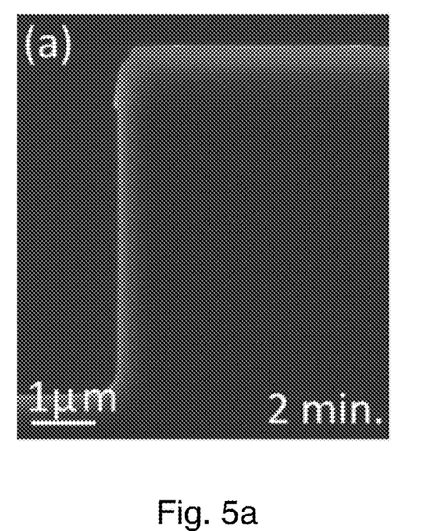
FIGS. 5a-c show undercut results for various etch times in an exemplary fabrication process.
Figure 5B:
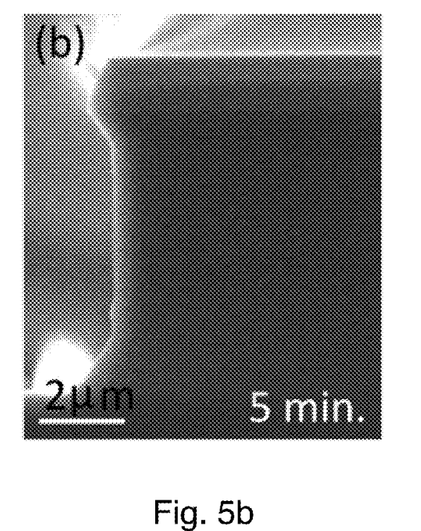
Figure 5C:
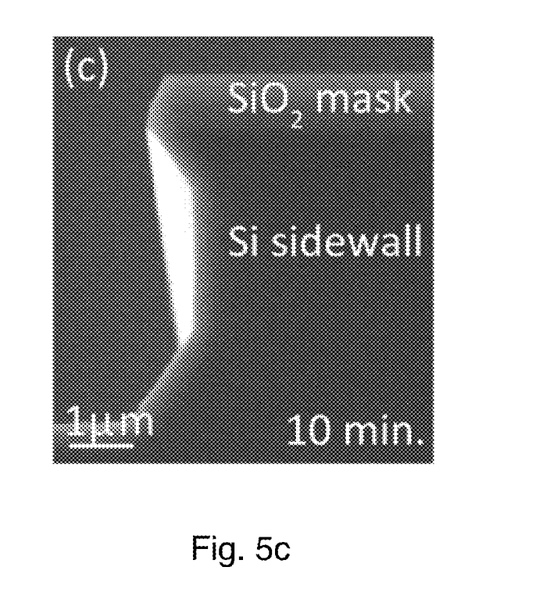

As shown in FIGS. 5a-c, the undercut can be controlled by the etch time used. Longer wet etch times of the Si sidewalls lead to greater amounts of undercut, as shown by these cross section scanning electron microscope (SEM) images of samples that were etched for (a) 2 minutes, (b) 5 minutes, and (c) 10 minutes. The wet etch used in this work, tetramethylammonium hydroxide, etches different crystal planes of Si at different rates, resulting in the faceting evident at longer etch times.

Following this wet etch, the wafer is thermally oxidized to form the $SiO_2$ spacer layer 414. The resulting structure is shown on FIG. 4d. Simulations show that optical reflections and scattering off this spacer layer decrease as the thickness of the $SiO_2$ spacer layer decreases. Thus, the spacer should only be as thick as is necessary for full coverage of the sidewall. In this work, we targeted a final spacer thickness of 80 nm, which simulations predict will transmit about 80% of the optical power. This thermal oxidation step also serves to remove damage to the Si surface at the bottom of the growth window that may have occurred during dry etching of this region.

After this, an anisotropic dry etch followed by a very short wet etch in 20:1 buffered oxide etch (BOE) are used to remove the thermal $SiO_2$ from the bottom of the growth window while leaving it on the sidewalls. The resulting structure is shown on FIG. 4e. The key to the success of this process is the presence of the overhanging $SiO_2$ growth mask, which serves to protect the spacer on the sidewalls from being etched while the $SiO_2$ layer at the bottom of the growth window is dry etched. During the subsequent buffered oxide wet etch, the thickness of the $SiO_2$ at the bottom of the growth window is much less than that on the sidewalls. Thus, the bottom of the growth window can be completely cleared of $SiO_2$ while a continuous layer is maintained on the sidewalls, including at the top edge of the Si sidewall directly under the $SiO_2$ growth mask layer, which was a weak point in prior work. After this, selective area growth provides the structure of FIG. 4f, where second semiconductor 416 was either pure Ge or Ge/SiGe quantum well samples.

B4) Epitaxial Growth Conditions

In this work, both Ge/SiGe quantum well samples and pure Ge samples were epitaxially grown on either a Si(001) substrate or a silicon-on-insulator substrate (with a 3 μm Si device layer and 375 nm buried oxide layer) in an Applied Materials Centura reduced-pressure chemical vapor deposition (RPCVD) reactor. The growth process used $GeH_4$ and $SiH_4$ in a $H_2$ carrier gas at a temperature of 405° C. and a system pressure of 40 Torr. No HCl was added to the process gases so selectivity was not optimal. To decrease the defect density and surface roughness, the quantum wells were grown on p-type $Si_{0.12}Ge_{0.88}$ buffer layers (in situ doped with boron) that underwent high temperature hydrogen annealing; the pure Ge samples also undergo multiple hydrogen anneals for heteroepitaxy (MHAH). To prevent dopant diffusion into the quantum wells, a layer of intrinsic $Si_{0.12}Ge_{0.88}$ was grown both before and after the quantum well region. The absorbing region was 20 quantum wells which were 15 nm wide with 35 nm barriers and a top capping layer of n-type, arsine-doped $Si_{0.12}Ge_{0.88}$.

B5) Results and Conclusion

As shown in FIGS. 6a-b, this altered design reliably leads to high-quality Ge growth with minimal sidewall growth. FIG. 6a is an angled image of a sample. Ge nucleation is evident on the top surface of the $SiO_2$ mask, indicating imperfect selectivity. FIG. 6b is a cross section SEM image showing Ge crystal facets at the edge of the growth window. For this result, a 5 minute TMAH wet etch was used, to ensure an adequate undercut of the Si sidewall while not greatly distorting the profile of the interface between the Si waveguide and the Ge modulation region.

Crystal faceting at the sidewalls, which has been observed in other selective-area growth work, is evident and points to well-controlled and high-quality growth. This faceting is believed to be due to different crystal planes of Ge or SiGe growing at different rates, depending on the growth temperature used. Furthermore, the process developed here is simpler than the previously proposed one, with fewer process steps. This fact, combined with the robustness that is built into the process design due to the presence of the overhanging $SiO_2$ masking layer, leads to much higher yields.

Random nucleation of the Ge growth occasionally occurred on the oxide-covered sidewalls and the top oxide growth mask, as seen in FIG. 6a. The density of growth nucleation varies, as the area of these clusters increases with increasing growth times. With the thick 2-5 µm growths used in this work, the nucleation would typically cover less than 10% of the surface area of the top oxide growth mask. This nucleation occurs especially at broken bonds on the oxide surface. Thermally grown oxide or adequately annealed deposited oxide are expected to have a low density of broken bonds on the surface; this is the reason we perform a high temperature anneal following the initial deposition of the LTO growth mask. Great care is taken to repair any possible damage to this top oxide layer that may be incurred during the subsequent spacer fabrication process. Specifically, exposure to a plasma during dry etching can break bonds and provide growth nucleation sites. Thus, following the final dry etch step (FIG. 4e), a high temperature anneal is performed on the substrates (1050° C. for 1 hour) to try to repair this dry etch damage to the oxide growth mask. However, as shown in FIG. 6a, it was difficult to completely prevent this nucleation from occurring. Completely preventing this nucleation would most likely require extensive development of new growth recipes using HCl to inhibit nucleation, which was not carried out in this work.

In conclusion, we have developed and demonstrated a process for preparing substrates for selective-area epitaxial growth of Ge and Ge/SiGe QWs in growth windows etched into the Si substrate or Si waveguides. This fabrication process results in a thin dielectric layer completely covering the exposed Si sidewalls of the growth region, preventing Ge growth from occurring on the sidewalls and restricting it to only the bottom of the growth window, as desired. This process enables future integrated low-loss, high-performance Ge and Ge/SiGe QW waveguide modulators and photodetectors monolithically integrated with SOI waveguides.

The invention claimed is:

1. A method for monolithic integration of dissimilar semiconductor materials, the method comprising:
   providing a substrate comprising a first semiconductor layer and one or more primary protective layers disposed on the first semiconductor layer;
   etching through the primary protective layers into the first semiconductor layer to provide a trench having side walls and a bottom;
   laterally undercutting at least one of the protective layers by selectively etching the side walls with a side wall etch that preferentially etches the first semiconductor layer with respect to the protective layers;
   forming a secondary protective layer on the side walls and bottom of the trench;
   removing the secondary protective layer from the bottom of the trench with a bottom layer etch that completely removes the secondary protective layer on the bottom of the trench and does not completely remove the secondary protective layer on the side walls of the trench; and
   growing a second semiconductor in the trench, wherein the first semiconductor layer and the second semiconductor have distinct compositions;
   wherein the substrate comprises a silicon on insulator wafer having a buried oxide layer sandwiched between a silicon substrate and a top silicon layer;
   wherein the bottom of the trench is in the top silicon layer.

2. The method of claim 1, wherein the primary protective layers include a semiconductor waveguide layer, and wherein the semiconductor waveguide layer is optically coupled to the second semiconductor.

3. The method of claim 2, wherein the primary protective layers include the semiconductor waveguide layer sandwiched between two waveguide cladding layers.

4. The method of claim 1, wherein the bottom layer etch comprises an anisotropic dry etch that removes some, but not all, of the secondary protective layer on the bottom of the trench, thereby providing a remnant bottom protective layer having a thickness from 10 nm to 20 nm, followed by a wet etch that removes the remnant bottom protective layer.

5. The method of claim 1, wherein the second semiconductor makes contact with the secondary protective layer on the side walls of the trench at one or more locations beneath the primary protective layer.

6. The method of claim 1, wherein the growth substrate comprises a silicon on insulator substrate, an indium phosphide substrate or a gallium arsenide substrate.

7. The method of claim 1, wherein the first semiconductor comprises silicon or indium phosphide.

8. The method of claim 1, wherein the second semiconductor comprises germanium, a SiGe alloy, or an InGaAs alloy.

9. Apparatus comprising:
   a substrate comprising a first semiconductor layer and one or more primary protective layers disposed on the first semiconductor layer;
   wherein a trench is formed in the substrate that extends through the primary protective layers and at least partially through the first semiconductor layer;
   wherein the trench is undercut, such that at least one of the primary protective layers laterally overhangs side walls of the trench present in the first semiconductor layer;
   a secondary protective layer disposed on side walls of the trench; and
   a second semiconductor formed by growth within the trench, wherein the first semiconductor layer and the second semiconductor have distinct compositions;
   wherein the substrate comprises a silicon on insulator wafer having a buried oxide layer sandwiched between a silicon substrate and a top silicon layer;
   wherein the bottom of the trench is in the top silicon layer.

10. The apparatus of claim 9, wherein the apparatus is part of an optical modulator, an optical detector, or an optical source.

11. The apparatus of claim 9, wherein the apparatus is part of an optoelectronic device integrated with a waveguide by end coupling.

12. The apparatus of claim 9, wherein at least one of the primary protective layers laterally overhangs an interface where the second semiconductor makes contact with the secondary protective layer.

13. The apparatus of claim 9, wherein the growth substrate comprises a silicon on insulator substrate, an indium phosphide substrate or a gallium arsenide substrate.

14. The apparatus of claim 9, wherein the first semiconductor comprises silicon or indium phosphide.

15. The apparatus of claim 9, wherein the second semiconductor comprises germanium, a SiGe alloy, an AlGaAs alloy, an InGaAs alloy, or an InGaAsP alloy.

* * * * *